United States Patent [19]

Moorehead, Jr.

[11] Patent Number: 5,825,634
[45] Date of Patent: Oct. 20, 1998

[54] CIRCUIT BOARD HAVING AN EMI SHIELDED AREA

[75] Inventor: Joseph W. Moorehead, Jr., Westerville, Ohio

[73] Assignee: BFGoodrich Avionics Systems, Inc., Richfield, Ohio

[21] Appl. No.: 577,024

[22] Filed: Dec. 22, 1995

[51] Int. Cl.$^6$ .................................................. H05K 9/00
[52] U.S. Cl. ......................... 361/816; 361/818; 361/749; 361/769; 174/35 GC
[58] Field of Search ................................... 361/818, 753, 361/816, 759, 769, 749; 174/35 GC, 35 R, 51, 50.63, 50.64; 439/607, 609, 608; 277/901, 213

[56] References Cited

U.S. PATENT DOCUMENTS

| | | | |
|---|---|---|---|
| 805,645 | 11/1905 | Guillot | 277/213 |
| 3,502,784 | 3/1970 | Kunkel | 277/901 |
| 3,505,463 | 4/1970 | McAdams | 277/901 |
| 4,788,381 | 11/1988 | Nilsson | 174/35 GC |
| 5,039,825 | 8/1991 | Samarov | 174/35 GC |
| 5,142,101 | 8/1992 | Matsuzaki et al. | 174/35 GC |
| 5,192,216 | 3/1993 | Knauber et al. | 439/108 |
| 5,250,751 | 10/1993 | Yamaguchi | 174/35 GC |
| 5,252,782 | 10/1993 | Cantrell et al. | 174/35 R |
| 5,404,276 | 4/1995 | Hansson et al. | 361/821 |

OTHER PUBLICATIONS

Engineering Bulletin # 27–0027–53, Rev. 5, Product Benefits; Spectrum control Inc., Erie, PA., 2 pgs. Data Sheet H–907, Tecknit Foil Laminates; Technit, a TWP Company, 1 pg.
Strip Metal Selection Guide for Strip Springs (1 pg); Visual Part Ref. Guide for Komposit Electronic Gaskets & Shields (2 pgs) & Strip Metal Gaskets & Grounding Products (2 pgs.); Instruments Specialities, Headquarters Phone (717)–424–8510.

*Primary Examiner*—Leo P. Picard
*Assistant Examiner*—Anthony Dinkins
*Attorney, Agent, or Firm*—Kevin L. Leffel

[57] ABSTRACT

The invention relates to Electromagnetic Interference ("EMI") shielding of electrical components mounted on circuit boards. An EMI shielded assembly is provided, comprising a circuit board having at least one electrical contact distributed around the perimeter of an area within which EMI shielding is desired, an EMI shielding cover encircling the area over the contact and covering the area, and a ring-like EMI shielding gasket encircling the area and compressed between the contact and the cover, the gasket in an uncompressed state having low portions alternated with high portions spaced around the gasket. The high portions are spaced away from the at least one electrical contact above the low portions, and the high portions are displaceable toward the low portions upon compression of the gasket. A method for EMI shielding is also provided.

20 Claims, 2 Drawing Sheets

CIRCUIT BOARD HAVING AN EMI SHIELDED AREA

BACKGROUND

The invention relates to the field of Electromagnetic Interference (EMI) shielding. In particular the invention relates to EMI shielding of electrical components mounted on circuit boards.

EMI shielding of certain electrical components mounted on circuit boards is an established practice if those components are negatively effected by EMI. According to established practice, a grounded conductive cover is placed over the circuit to be protected. The cover intercepts EMI and reduces or eliminates negative EMI effects upon the protected electrical component.

According to a prevalent established practice, the circuit board is provided with a grounded conductive contact, and a conductive fence is soldered to the contact encircling the area to be EMI shielded. The cover is then soldered to the fence. Though certainly effective, performing the soldering operations is difficult and time consuming. In addition, removing the cover is difficult for subsequent testing and/or replacement of circuit components, and removing the cover requires another soldering operation to replace it.

Therefore, an EMI shielded assembly and a method for EMI shielding an area of a circuit board are generally desired wherein the cover is easily installed and removed.

SUMMARY OF THE INVENTION

According to an aspect of the invention, an EMI shielded assembly is provided, comprising:
  a circuit board having at least one electrical contact distributed around the perimeter of an area within which EMI shielding is desired;
  an EMI shielding cover encircling the area over the contact and covering the area; and,
  a ring-like EMI shielding gasket encircling the area and compressed between the contact and the cover, the gasket in an uncompressed state having low portions alternated with high portions spaced around the gasket, the high portions being spaced away from the at least one electrical contact above the low portions, and the high portions being displaceable toward the low portions upon compression of the gasket.

According to another aspect of the invention, a method is provided for EMI shielding an area of a circuit board, comprising the steps of:
  providing at least one electrical contact distributed around the perimeter of the area;
  placing a ring-like EMI shielding gasket over the contact and encircling the area, the gasket in an uncompressed state having low portions alternated with high portions spaced around the gasket, the high portions being spaced away from the at least one electrical contact above the low portions, and the high portions being displaceable toward the low portions upon compression of the gasket;
  placing an EMI shielding cover encircling the area over the gasket and covering the area; and,
  forcing the cover toward the at least one contact thereby compressing the gasket between the cover and the at least one contact.

The invention provides a shielded assembly and method wherein the cover is easily installed and removed. A shielded assembly according to the invention exhibits suitable EMI shielding capabilities for shielding many types of useful electrical components.

DETAILED DESCRIPTION

Figure 1:
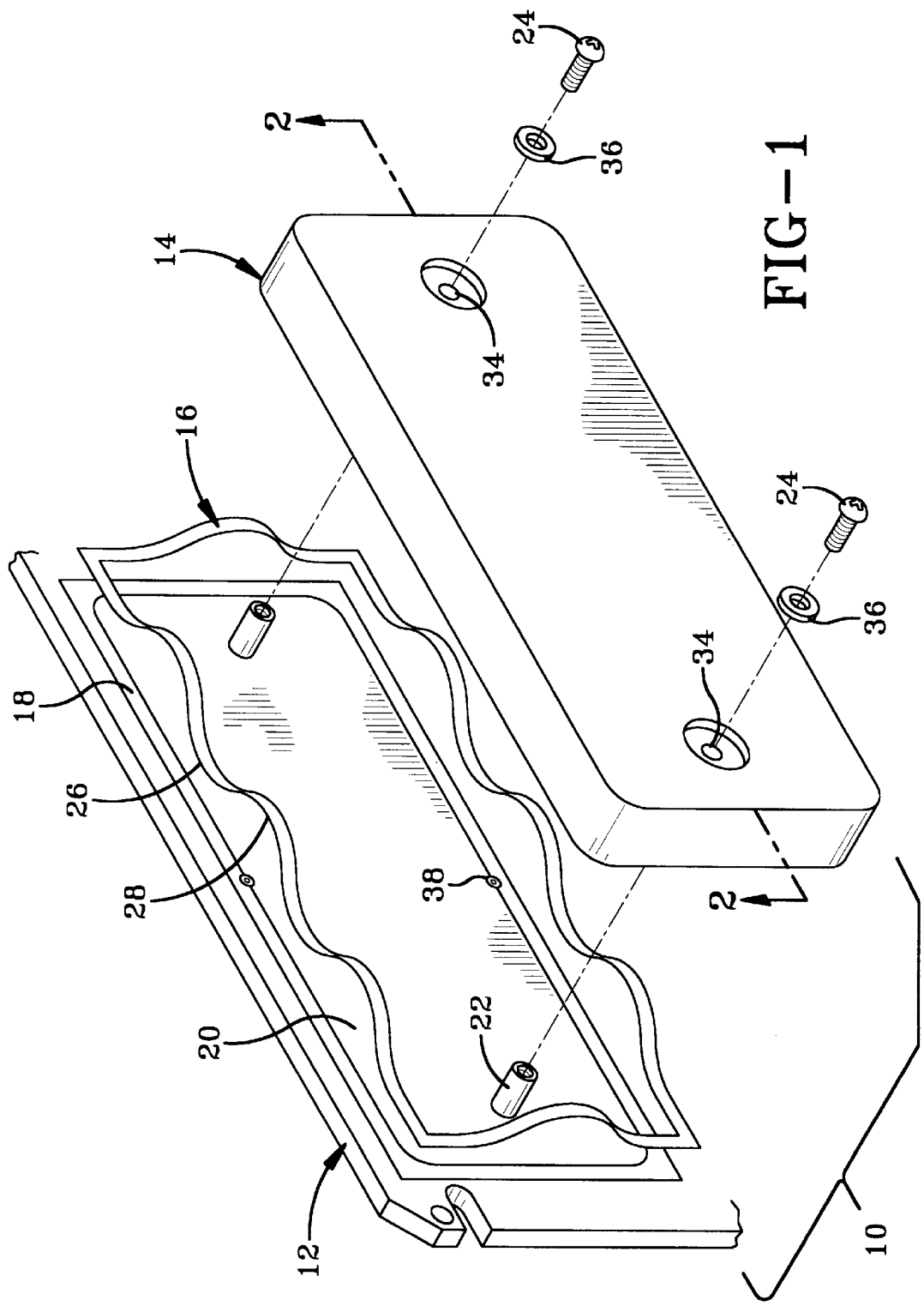
FIG. 1 presents an exploded view of an EMI shielded assembly according to an aspect of the invention.
Figure 2:
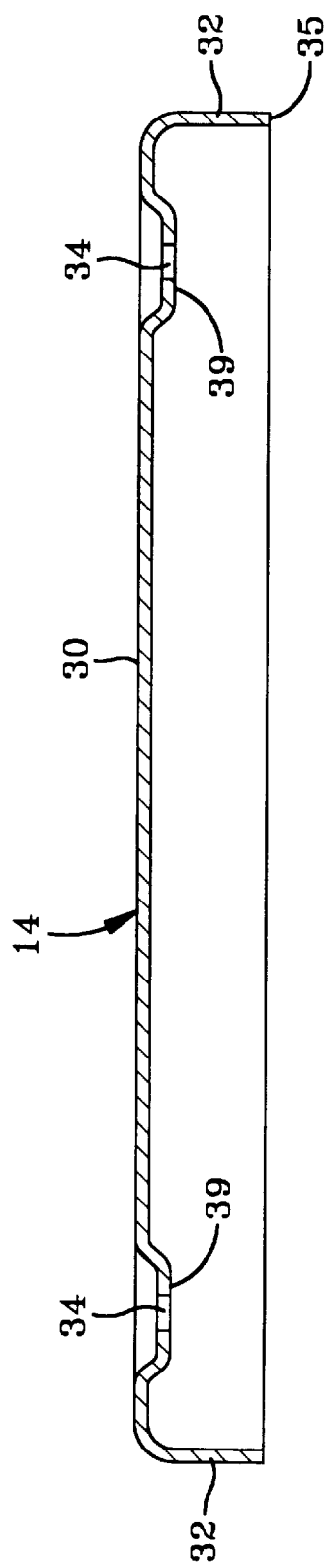
FIG. 2 presents a sectional view of a cover along line 2—2 of FIG. 1.

Various aspects of the invention are presented in FIGS. 1 and 2, wherein like components in the various views are numbered alike. Referring now specifically to FIG. 1, an exploded view of an electrical device with Electromagnetic Interference ("EMI") shielding indicated generally at 10 is presented according to an aspect of the invention. The device 10 comprises a circuit board 12, an EMI shielding cover 14, and a ring-like EMI shielding gasket 16. Only a portion of the circuit board 12 is presented in order to simplify the illustration. The circuit board 12 has at least one electrical contact 18 distributed around the perimeter of an area 20 within which EMI shielding is desired. The EMI shielding cover encircles and covers the area 20, and is attached to the circuit board by at least one fastener. In the embodiment presented, the fastener comprises a pair of threaded fasteners 24 that cooperate with a pair of stand-offs 22 attached to the circuit board within the area 20. Each stand-off 22 has a threaded hole that receives and engages a threaded fastener 24. The ring-like EMI shielding gasket 16 encircles the area 20 and is compressed between the contact 18 and the cover 14 when the cover 14 is attached to the circuit board 12. An electrical circuit or other electrical device (not shown) for which shielding is desired is included within area 20 beneath the cover 14, and may be attached to the circuit board 12. The electrical device may be sensitive to EMI, in which case, shielding according to the invention protects the electrical device from externally generated EMI. The electrical device may also emit EMI, in which case, shielding according to the invention contains the EMI thereby protecting electrical devices mounted in other areas of the circuit board. The shielded electrical device may comprise any electrical device that may be attached to a circuit board, any of which are considered to fall within the purview of the invention, including printed circuits and magnetic storage devices. The invention is preferably used to shield printed circuits.

The gasket 16 in an uncompressed state has low portions 26 alternated with high portions 28 spaced around the gasket 16. The high portions 28 are spaced away from the electrical contact 18 above the low portions 26, and the high portions 28 are displaceable toward the low portions 26 upon compression of the gasket between the circuit board 12 and cover 14. Each of the low portions 26 preferably presses against the contact 18, and each of the high portions preferably presses against the cover 14 when the cover is attached to the circuit board. The contact, 18, gasket 16 and cover 14 are conductive, and are preferably formed from a metal. The contact 14 is grounded, which also grounds the cover 14 through the gasket 16, thus shielding the area 20 from EMI. Good electrical connection between the contact 18 and cover 14 is maintained by virtue of the gasket having the low portions 26 and high portions 28. This feature eliminates the need to solder the cover 14 to the contact 18, and greatly facilitates installation and removal of the cover 14. Each distance from one of the high portions 28 to the next and each distance from one of the low portions 26 to the next may be less than a minimum EMI wavelength for which shielding is desired. The gasket preferably resists being compressed in a spring-like manner. According to a preferred embodiment, the gasket comprises a metal ribbon passing back and forth between the high portions 28 and the low portions 26 in a generally sinusoidal manner. However, other shapes are possible, any of which are considered to fall within the purview of the invention, including dimpled, sawtooth, and trapezoidal profiles.

Referring now to FIG. 2, a sectional view of the cover 14 along line 2—2 of FIG. 1 is presented. Cover 14 has a top portion 30 joined to a side portion 32 that encircles the top portion 30. The side portion 32 terminates in a seat 35 that presses against the gasket 16 of FIG. 1 when the cover 14 is attached to the circuit board 12. The cover 14 may be formed according to known techniques, for example, by stamping sheet metal. The method used for forming the cover is not critical in the practice of the invention, and any variation in method of manufacture is considered to fall within the purview of the invention. When completed, the cover 14 is preferably a single piece having no holes or cracks through which EMI may leak. A pair of attachment holes 34 may be provided for attaching the cover 14 to the circuit board 12 of FIG. 1 via stand-offs 22 and screws 24. EMI leakage through these holes is prevented if the stand-offs 22 are formed from a metal since the stand-offs press against the cover 14 and completely cover the holes 34 after attachment of the cover 14 to the circuit board 12. EMI leakage through the circuit board 12 may be minimized or eliminated by using a laminated circuit board having one or more conductive foil laminations (copper, for example). Electrical continuity with the contact 18 may be established by forming holes 38 through the circuit board adjacent or within the contact 18, and through-plating the holes 38 in a manner well known in the art. It is not intended to limit the invention to any specific method of minimizing or eliminating EMI leakage through the circuit board.

At least one fastener forces the cover 14 toward the contact 18 and compresses the gasket 16 between the rim 36 (FIG. 2) and the contact 18. In the embodiment presented, the fastener comprises a pair of threaded fasteners 24, which in this example are metal screws 24. At least one threaded fastener 24 and at least one stand-off 22 may be provided. The fasteners 24 may also include one or more washers 36. However, other attachment techniques may be used in the practice of the invention, any of which are considered to fall within the purview of the invention, including clips attached to the cover 14 and/or the circuit board 12, and captivation by adjacent structures. The fastener may be permanently attached to the cover 14, if desired. For example, a clip could be formed as an integral part of the cover 14, or the screws 24 could be captive within the holes 34. Regardless of the type of fastener employed, the excessive stresses should be avoided in the cover 14 and the circuit board 12. The term "excessive stresses" refers to bending and/or shear stresses that cause damage or unacceptable distortion. If screws 24 and stand-offs 22 are utilized, the stand-offs 22 and cover 14 may be dimensioned to permit compression of the gasket 16 sufficient to seal against EMI, and limit movement of the cover 14 toward the circuit board 12 thereby preventing excessive stresses in the cover 14 and the circuit board 12. The cover 14 moves toward the circuit board 12, compressing the gasket 16, as the screws 24 are tightened until the cover 14 engages the stand-offs 22. The gasket 16 is not subjected to additional compressive force by tightening the screws 24 after the cover 14 engages the stand-offs 22. One or more seats 38 may be provided that engage one or more stand-offs 22. Though described in relationship to the embodiment presented having screws 24 and stand-offs 22, other ways of limiting compressive force are possible, and it is not intended to limit the invention to the specific embodiment of FIG. 1.

According to a further aspect of the invention, a method is provided for EMI shielding an area on a circuit board. The method comprises the steps of providing a circuit board having at least one electrical contact 18 distributed around the area 20 to be EMI shielded, placing a ring-like EMI shielding gasket 16 over the contact 18 and encircling the area 20, the gasket 16 in an uncompressed state having low portions 26 alternated with high portions 28 spaced around the gasket 16 (as previously described), covering the area 20 with an EMI shielding cover 14, and forcing the cover 14 toward the at least one contact 18 thereby compressing the gasket 16 between the cover 14 and the at least one contact 18. The various components used in the method may have one or more of the features previously described in relation to FIGS. 1 and 2.

The cover 14 and gasket 16 may be formed from any materials that provide suitable EMI shielding. In many applications, the cover 14 may be formed from soft stamped aluminum, which is lightweight and relatively inexpensive. However, the cover may also be formed from nickel-iron alloys and other ferrous alloys having EMI shielding properties. The gasket 16 is preferably formed from a conductive alloy having spring qualities, including stainless steel, beryllium copper, and phosphor bronze. The contact 18 may be formed from materials known for use on circuit boards, such as etched copper foil, and the circuit board 12 may be formed from materials known for use as circuit boards, including fiber reinforced plastic composites. Galvanic incompatibility is preferably avoided. In most cases, the proper application of coatings and platings will effectively minimize the effects of electrochemical reaction. More exotic platings such as gold, silver, or nickel may be employed In severe applications which may involve combinations of high humidity, variation in temperature, and exposure to salt fog. It is not intended to limit the invention to specific materials for the various components.

In general, the distance between contact points, meaning the distance from the center of one high portion 28 to the center of the immediately adjacent low portion 26 on the gasket 16 ("peak to trough"), is preferably less than ⅛ the wavelength of the highest frequency that may influence the shielded electrical device. This also applies to shielded devices that require containment to prevent EMI from influencing other adjacent devices. Spacing the points of contact closer will provide increased signal attenuation for harmonics. However, the decrease in distance between contact points becomes increasingly expensive to manufacture, particularly if the distance is less than about ¼ inch. The benefits of decreasing the distance between contact points must be weighed against increasing manufacturing costs. The maximum frequency for which shielding is desired may be determined according to methods known in the art by an artisan skilled in the art that is familiar with the particular application.

In a particular application, 1.09 GHz was the maximum frequency for which shielding was desired corresponding to a wavelength of about 10.83 inches. This wavelength divided by eight (8) equaled 1.32 inches. A wave gasket having a distance between contact points ("peak to trough") of about 0.25 inch was employed, which was cost effective with existing manufacturing techniques and provided very effective EMI attenuation. Note that a distance between contact points of about 0.25 inch, as defined herein, resulted in a distance of about 0.5 inch from one high portion 28 to the next ("between peaks") and from one low portion 26 to the next ("between troughs"). The cover was made from series 3003 aluminum and coated with a chemical conversion coating according to MIL-C-5541 E, Class 3, which oxidized the aluminum surface using chromic acid. The coating had a natural ability to conduct energy in the radio frequency range. The coating also minimized any electrochemical reactions with other contacting metals. The gasket was passivated stainless steel which had a low electrical potential when placed in contact with the conversion coated aluminum cover. The circuit board contact was a conventional tin-lead alloy used in standard circuit board plating.

It is evident that many variations are apparent to those skilled in the art without departing from the true scope and spirit of the invention as defined by the following claims.

I claim:

1. An EMI shielded assembly, comprising:
   a circuit board having at least one electrical contact distributed around the perimeter of an area within which EMI shielding is desired;
   an EMI shielding cover encircling said area over said contact and covering said area; and,
   a ring-like EMI shielding gasket encircling said area and compressed between said contact and said cover, said gasket in an uncompressed state having low portions alternated with high portions spaced around said gasket, said high portions being spaced away from said at least one electrical contact above said low portions, and said high portions being displaceable toward said low portions upon compression of said gasket.

2. The assembly of claim 1, wherein said gasket and said cover are metal.

3. The assembly of claim 2, wherein said cover is a single piece.

4. The assembly of claim 1, wherein said gasket resists being compressed in a spring-like manner.

5. The assembly of claim 1, wherein each distance from one of said high portions to the next and each distance from one of said low portions to the next is less than a minimum EMI wavelength for which shielding is desired.

6. The assembly of claim 1, wherein said gasket comprises a metal ribbon passing back and forth between said high portions and said low portions in a generally sinusoidal manner.

7. The assembly of claim 6, wherein each distance from one of said high portions to the next high portion and each distance from one of said low portions to the next low portion is less than a minimum EMI wavelength for which shielding is desired.

8. The assembly of claim 1, wherein said gasket is compressed by at least one fastener that forces said cover toward said contact.

9. The assembly of claim 1, wherein said gasket is compressed by at least one fastener that forces said cover toward said contact; and,
   further comprising a stand-off attached to said circuit board that engages said cover and permits compression of said gasket sufficient to seal against EMI, and limits movement of said cover toward said circuit board thereby preventing excessive stresses in said cover and said circuit board.

10. The assembly of claim 9, wherein said at least one fastener comprises a threaded fastener, said at least one stand-off is attached to said circuit board within said area, said cover having at least one hole that receives said threaded fastener with said threaded fastener covering said hole to prevent EMI leakage through said hole, and said at least one standoff having a threaded hole that engages said threaded fastener.

11. A method for EMI shielding an area of a circuit board, comprising the steps of:
   providing at least one electrical contact distributed around the perimeter of said area;
   placing a ring-like EMI shielding gasket over said contact and encircling said area, said gasket in an uncompressed state having low portions alternated with high portions spaced around said gasket, said high portions being spaced away from said at least one electrical contact above said low portions, and said high portions being displaceable toward said low portions upon compression of said gasket;
   placing an EMI shielding cover encircling said area over said gasket and covering said area; and,
   forcing said cover toward said at least one contact thereby compressing said gasket between said cover and said at least one contact.

12. The method of claim 11, wherein said gasket and said cover are metal.

13. The method of claim 12, wherein said cover is a single piece.

14. The method of claim 11, wherein said gasket resists being compressed in a spring-like manner.

15. The method of claim 11, wherein each distance from one of said high portions to the next and each distance from one of said low portions to the next is less than a minimum EMI wavelength for which shielding is desired.

16. The method of claim 11, wherein said gasket comprises a metal ribbon passing back and forth between said high portions and said low portions in a generally sinusoidal manner.

17. The method of claim 16, wherein each distance from one of said high portions to the next high portion and each distance from one of said low portions to the next low portion is less than a minimum EMI wavelength for which shielding is desired.

18. The method of claim 11, wherein said gasket is compressed by at least one fastener that forces said cover toward said contact.

19. The method of claim 11, wherein said gasket is compressed by at least one fastener that forces said cover toward said contact; and,
   further comprising a stand-off attached to said circuit board that engages said cover and permits compression of said gasket sufficient to seal against EMI, and limits movement of said cover toward said circuit board thereby preventing excessive stresses in said cover and said circuit board.

20. The method of claim 19, wherein said at least one fastener comprises a threaded fastener, said at least one stand-off is attached to said circuit board within said cover, said cover having at least one hole that receives said threaded fastener with said threaded fastener covering said hole to prevent EMI leakage through said hole, and said at least one standoff having a threaded hole that engages said threaded fastener.

* * * * *